(12) United States Patent
Pance et al.

(10) Patent No.: US 8,339,028 B2
(45) Date of Patent: Dec. 25, 2012

(54) MULTICOLOR LIGHT EMITTING DIODES

(75) Inventors: Aleksandar Pance, Saratoga, CA (US);
Duncan Kerr, San Francisco, CA (US);
Brett Bilbrey, Sunnyvale, CA (US);
Michael F. Culbert, Monte Sereno, CA (US)

(73) Assignee: Apple Inc., Cupertino, CA (US)

( * ) Notice: Subject to any disclaimer, the term of this patent is extended or adjusted under 35 U.S.C. 154(b) by 506 days.

(21) Appl. No.: 12/495,353

(22) Filed: Jun. 30, 2009

(65) Prior Publication Data

US 2010/0328936 A1  Dec. 30, 2010

(51) Int. Cl.
*H01J 1/62* (2006.01)

(52) U.S. Cl. ........................................... 313/498

(58) Field of Classification Search ........... 313/498–512
See application file for complete search history.

(56) References Cited

U.S. PATENT DOCUMENTS

| | | |
|---|---|---|
| 7,236,154 B1 | 6/2007 | Kerr et al. |
| 7,322,731 B2 | 1/2008 | Epstein et al. |
| 7,364,306 B2 | 4/2008 | Margulis |
| 7,455,423 B2 | 11/2008 | Takenaka |
| 7,656,371 B2 | 2/2010 | Shimizu et al. |
| 7,679,828 B2 | 3/2010 | Munro |
| 7,736,047 B2 | 6/2010 | Ohashi et al. |
| 7,750,282 B2 | 7/2010 | Mahowald et al. |
| 7,872,430 B2 | 1/2011 | Roberts et al. |
| 7,888,883 B2 | 2/2011 | Crawford et al. |
| 2003/0043589 A1 | 3/2003 | Blank |
| 2004/0195494 A1 | 10/2004 | Kok et al. |
| 2004/0204190 A1 | 10/2004 | Dietrich et al. |
| 2006/0033443 A1 | 2/2006 | Ishii et al. |
| 2007/0019394 A1 | 1/2007 | Park et al. |
| 2007/0090962 A1 | 4/2007 | Price et al. |
| 2008/0094004 A1 | 4/2008 | Ackermann |
| 2008/0111500 A1 | 5/2008 | Hoover |
| 2008/0247722 A1 | 10/2008 | Van Gorkom et al. |
| 2010/0328935 A1 | 12/2010 | Pance et al. |

FOREIGN PATENT DOCUMENTS

| | | |
|---|---|---|
| CN | 201185147 | 1/2009 |
| JP | 04212289 | 8/1992 |
| JP | 04324294 | 11/1992 |
| JP | 05238309 | 9/1993 |
| JP | 06251889 | 9/1994 |
| JP | 06318050 | 11/1994 |
| JP | 07014694 | 1/1995 |

(Continued)

OTHER PUBLICATIONS

International Search Report, PCT Application No. PCT/US2010/034595, 3 pages, Aug. 25, 2010.

*Primary Examiner* — Joseph L Williams
(74) *Attorney, Agent, or Firm* — Park, Vaughan, Fleming & Dowler LLP

(57) ABSTRACT

A device such as a multicolor light emitting diode that emits different colors of light and that may combine the different colors emitted by individual light emitting diodes. The multicolor LED may include a common anode terminal that may be connected to each anode of the individual light emitting diodes. The multicolor LED may be a five terminal multicolor LED. Additionally, the multicolor LED may include two anode terminals, in which the first anode terminal may be a common anode terminal connected to three of the individual color LEDs and the second anode terminal may be connected to an anode of a white LED. In this embodiment, the multicolor LED may be a six terminal multicolor LED.

10 Claims, 6 Drawing Sheets

FOREIGN PATENT DOCUMENTS

| | | |
|---|---|---|
| JP | 10073865 | 3/1998 |
| JP | 2000098942 | 4/2000 |
| JP | 2005032470 | 2/2005 |
| JP | 2005293853 | 10/2005 |
| JP | 2006041043 | 2/2006 |
| KR | 100870113 | 11/2008 |
| WO | WO2007/071397 | 6/2007 |
| WO | WO2008/038915 | 4/2008 |

MULTICOLOR LIGHT EMITTING DIODES

CROSS-REFERENCE TO RELATED APPLICATIONS

This application is related to U.S. nonprovisional application Ser. No. 12/495,230, titled "Multicolor Lighting System," identified as and filed on Jun. 30, 2009, which is incorporated herein as if set forth in its entirety.

BACKGROUND

1. Technical Field

The present invention generally relates to light emitting diodes and, more specifically, to multicolor light emitting diodes.

2. Background Discussion

Many electronic components, devices and/or systems employ some type of light source which may be used for various purposes such as providing light for better visibility, decoration, indicators, imaging and so on. Depending on the use, the type of light source may be fluorescent, halogen, incandescent, mercury vapor, high pressure or low pressure sodium, light emitting diodes ("LEDs") and so on.

In particular, LEDs may be used in a number of applications and may provide light more efficiently. They may also yield increased performance lifetimes over other light sources such as, incandescent lights. Additionally, LEDs may have other advantages such as smaller packaging sizes, increased power efficiency and so on. LEDs may also produce and/or transmit less thermal energy, thus keeping the casing and/or packaging surrounding the LEDs cooler than other light sources.

Although LEDs may more efficiently produce light than many of the previously mentioned traditional light sources, the intensity of the light emitted by LEDs may not be sufficient for some purposes and/or a greater intensity of light may be desirable. For example, a greater light intensity may be desirable for employing LEDs as indicators, light sources for visibility, backlighting, imaging and so on. Additionally, the LED light intensity may depend on the LED color. In one example, red light may have a greater intensity than blue light at the same power, but it may be desirable to display the colors at similar intensities. Accordingly, there is a need in the art for an improved device that includes the ability to provide multiple colors at a range of intensities.

SUMMARY

Generally, one embodiment of the present invention may take the form of a multicolor light emitting diode. The multicolor light emitting diode may include a first light emitting diode that emits white light, a second light emitting diode that emits red light, a third light emitting diode that emits green light, a fourth light emitting diode that emits blue light and a housing surrounding at least the first light emitting diode, the second light emitting diode, the third light emitting diode and the fourth light emitting diode. The multicolor light emitting diode may also include a window defined in the housing, such that each of the first, second, third, and fourth light emitting diodes may emit light through the window. Additionally, the multicolor light emitting diode may include four cathode terminals and a common anode terminal, such that the cathode and the anode may be connected to the housing. Each one of the four cathode terminals may be operationally connected on a one to one basis to each of the cathodes of the first, second, third and fourth light emitting diodes and the common anode terminal may be operationally connected to all of the anodes of first, second, third and fourth light emitting diodes.

Another embodiment may take the form of a method for providing colors of light. In this method a first light emitting diode that emits white light may be provided, as well as a second light emitting diode that emits red light, a third light emitting diode that emits green light, a fourth light emitting diode that emits blue light. Additionally, at least the first light emitting diode, the second light emitting diode, the third light emitting diode and the fourth light emitting diode may be surrounded by a housing. Separate windows may be defined in the housing for each of the first, second, third, and fourth light emitting diodes so that the light emitted by each may pass through the separate windows. Additionally, four cathode terminals and a common anode terminal may be connected to the housing and each one of the four cathode terminals may be operationally connected on a one to one basis to each of the cathodes of the first, second, third and fourth light emitting diodes, and the common anode terminal may be operationally connected to all of the anodes of first, second, third and fourth light emitting diodes.

These and other advantages and features of the present invention will become apparent to those of ordinary skill in the art upon reading this disclosure in its entirety.

DETAILED DESCRIPTION OF EMBODIMENTS

Figure 1:
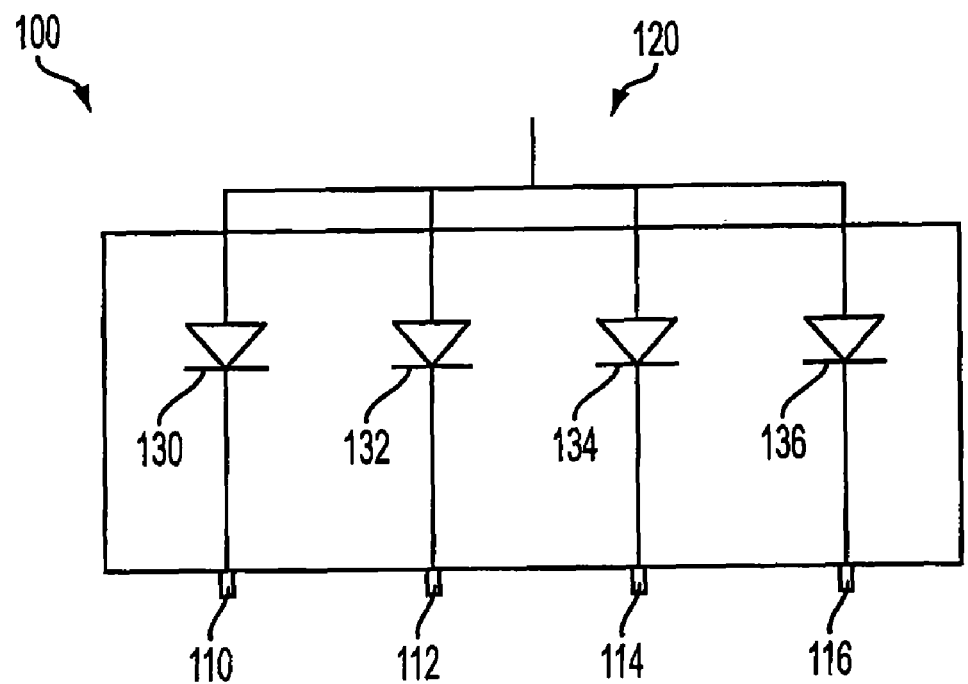
FIG. 1 depicts an embodiment of a multicolor LED schematic.

Generally, one embodiment may take the form of an electronic device, such as an LED, which may be capable of emitting various colors individually or in combination. In this embodiment, the LED may be a multicolor LED, which may include and incorporate multiple individual LEDs that may emit different colors of light from one another. For example, the multicolor LED may include individual LEDs, each emitting one of red, green, blue and white light. Generally, an LED that emits red light may be referred to herein as a "red LED," an LED that emits green light may be referred to herein as a "green LED," and so on. Continuing this example, the multicolor LED may emit white light in various ways, such as by combining the emitted colors of the red LED, the green LED and the blue LED, by using the white LED alone, and/or any combination thereof.

Continuing the description of the embodiment, the multicolor LED may be packaged in a number of ways. In one example, light may be emitted from the top of the package. In another example, light may emanate from the side of the package. In other embodiments the light may be emitted from any package surface depending on the configuration of the LED package. For example, the multicolor LED may be a top-firing multicolor LED and the multicolor LED packaging may allow light to be emitted from a transparent window defined in the top of the package.

Continuing the embodiment, the multicolor LED may be configured so that two or more of the individual LEDs may share a common anode, each LED may have an individual anode, or all of the individual LEDs of the multicolor LED may share a common anode. For example, the red LED, the green LED and the blue LED may share a common anode and the white LED may have a separate anode, all four of the LEDs may share a common anode and so on.

Another embodiment may take the form of a method for producing various colors, including white light, from a single device such as a multicolor LED. The multicolor LED may include individual LEDs, each of which may emit different colors from one another (or some of the individual LEDs may emit different colors than others). By combining the different colors emitted by the individual LEDs, the resulting emitted color may be a different color, or may be a different intensity color. For example, the multicolor LED may emit a white light by combining red, green and blue colors emitted respectively by a red LED, a green LED and a blue LED and may increase the intensity of the white light by additionally combining white light emitted by a white LED. Additionally, white light may be produced at a better power efficiency by combining the emitted light from the red, green, blue and white LEDs, then by producing white light by combining only the emitted light from the red, green and blue LEDs without the white light from the white LED.

It should be noted that embodiments described herein may be used in a variety of image processing and/or lighting systems. The embodiment may include or work with a variety of display components, monitors, screens, images, sensors, indicators and electrical devices. Aspects of the present invention may be used with practically any apparatus related to optical and electrical devices, display systems, presentation systems or any apparatus that may contain any type of display and/or lighting system. Accordingly, embodiments of the present invention may be employed in computing systems and devices used in visual presentations and peripherals and so on.

Before explaining the disclosed embodiments in detail, it should be understood that the embodiments are not limited in their application to the details of the particular arrangements shown, because other embodiments are possible. Also, the terminology used herein is given for description and not limitation.

FIG. 1 depicts a schematic of a sample electronic device 100. The electronic device 100 may be a multicolor LED 100 configured to emit one or more colors of light. Typically, multicolor LEDs include more than one individual LED, each of which may emit a certain wavelength of light corresponding to a color range. Generally, a single LED emits wavelengths of a single color, such as red. By varying either the duty cycle of or voltage to the LED, the intensity of the emitted light may be varied. For some LEDs, changes in input voltage may yield changes in the outputted light's wavelength. Each individual LED of the multicolor LED may emit the same color or may emit different colors. For example, a multicolor LED may have four LEDs and all of the four LEDs may emit red light, or two of the four LEDs may emit red light, one LED may emit green light and the remaining LED may emit blue light, or each of the LEDs may emit a different color light from all others. Additionally, multicolor LEDs may include various numbers of individual LEDs as appropriate. In another example and as shown in FIG. 1, the multicolor LED 100 may be housed in a single package and may include four individual LEDs, specifically a white LED 130, a red LED 132, a green LED 134 and a blue LED 136.

FIG. 1, depicts a multicolor LED that produces different colors from each of the individual LEDs. Although LED 100 includes only four LEDs, the multicolor LED 100 may contain any number of individual LEDs greater than one LED, in which the individual LEDs may produce the same or different colors as one another. Additionally, although the LEDs 130, 132, 134 and 136 are depicted as configured in a specific order left to right in FIG. 1, and with specific colors, the individual LEDs of a multicolor LED may configured in various arrangements, may include fewer LEDs or a greater number of LEDs, and may emit various colors.

Generally, LEDs may emit light in wavelengths across the visible, ultraviolet and infrared spectrum. In the example of FIG. 1, the multicolor LED 100 may emit colors other than those generated by a single LED by combining two or more colors to produce a color other than red, green, blue or white. Combining colors to produce a different color may be referred to as "additive color mixing." For example, the LED may emit a magenta color by combining red and blue light. In another example, the LED may emit white light by combining equal intensities of red, green and blue light. Combining different colors of light with white light will be discussed in more detail below. Although a specific color may be referred to herein, it should be understood that such a color may any of a range of wavelengths. For example, the color produced by an LED emitting light between the wavelengths 610 nanometers (nm) and 760 nm may appear, and be referred to as "red."

LED colors may be combined to produce different colors, but may also be combined to change the saturation of the color and/or to provide a greater intensity. As used herein, saturation generally refers to the amount of white light in the resulting color. For example, white light and red light may be combined to produce a resulting color and may be referred to as a pastel red (a less saturated red). Each of these effects will be discussed in further detail below.

The resulting color may be distinct from the color emitted by either of the two light sources or may appear as a similar color to one of the two light sources. For example, a light emitted by a red LED and a blue LED may be combined to produce a yellow color, in which the yellow color may be at a greater intensity than either one of the colors emitted by the red LED or the blue LED when viewed individually. In another example, the light emitted by a red LED and a white LED may be combined to emit a reddish color, which may be at a greater intensity than light emitted by either one of the red LED or the white LED when viewed individually. The combined emitted light may be a more pastel red color (less saturated red), than the red light emitted by the red LED when viewed individually. Generally, adding together the light emitted from two or more light sources, both at a defined power, may result in an outputted light having increased intensity as well as a different tint or saturation when compared to either one of the two constituent light sources individually.

By varying the light intensities of the light emitted by each of the individual LEDs, the combinations of colors may also be varied. Generally, an LED may emit a color at different intensities. For example, although the red light emitted by the red LED 132 may also be combined with the white light emitted by the white LED 130 to produce a pastel (although intense) color red, the two emitted colors may have different intensities. Continuing this example, the red light emitted by the red LED 132 may be at a minimum intensity and the white light emitted by the white LED 130 may be at a maximum intensity, thus producing a pale pink-white light. Alternatively, the red light emitted by the red LED 132 may be at a maximum intensity and the white light emitted by the white LED 130 may be at a minimum intensity and produce a less saturated red color that may appear as a slightly faded reddish color. The color combinations produced by varying the light intensities of the light emitted by the individual LEDs may or may not fall within either one of the frequency ranges of the light emitted by the individual LEDs.

In the embodiment of FIG. 1, white light may be produced in various ways such as by combining the three emitted colors of red LED 132, green LED 134 and blue LED 136, or by emitting white light from the white LED 130 or by combining various other colors in combination as appropriate to produce white light. Stated differently, combining any number of colors in the appropriate combinations may also produce white light. For example, the magenta light emitted by a magenta LED in combination with the green light emitted by a green LED may produce white light.

Additionally, as previously discussed, a multicolor LED may emit white light with increased intensity by combining the light emitted by the combination of the three LEDs (red LED 132, green LED 134, blue LED 136) and the white LED 130. The white LED 130 may be used in combination with the three LEDs 132, 134, 136 of FIG. 1 in order to increase the intensity of the white light produced by the three LEDs, or may be used to increase the power efficiency of LED 100. For example, assuming the same intensity, the white LED 130 may produce a white light more efficiently in comparison to producing a white light using the three LEDs in combination to produce white light. Generally, power efficiency of an LED, as discussed herein, may refer to the light output per unit power input.

Generally an LED may have a cathode and an anode. As used herein, the phrases regarding the LED being forward biased, switched "on" or with a closed switch, all refer to the same LED state and all indicate that the individual LEDs may emit light when in the aforementioned state.

Still with respect to FIG. 1, the white LED 130, red LED 132, green LED 134 and blue LED 136 may be operationally or directly connected and in parallel with one another. The multicolor LED 100 may include a common anode 120 and separate cathodes 110, 112, 114, 116. The anodes and cathodes of LEDs 130, 132, 134 and 136 may be operationally or directly connected to the respective package terminals and the connections will be described in further detail below. Generally, common anodes may provide increased flexibility of use. For example, a multicolor LED with a common anode may include multiple terminals connected to the common anode, thus providing a greater number of ways to connect to the common anode of the multicolor LED.

In FIG. 1, the white LED 130 is connected to the common anode 120. Similarly, the red LED 132, green LED 134 and blue LED 136 are also connected to the common anode 120. Further, the white LED 130 may be connected to a first cathode 110, the red LED 132 may be connected to a second, separate cathode 112, the green LED 134 may be connected to a third, separate cathode 114 and the blue LED 136 may be connected to a fourth, separate cathode 116. Generally, the common anode may be connected to two or more of the LED anodes, which will be discussed in further detail below with respect to FIGS. 4-6.

Figure 2:
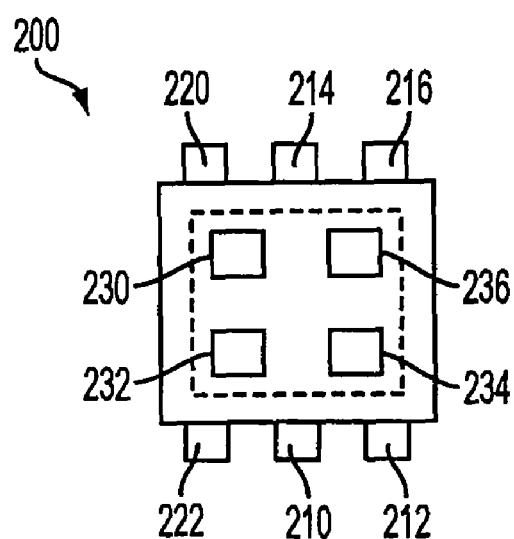
FIG. 2 depicts an embodiment of the present invention as a top firing five terminal multicolor LED package.

FIG. 2 depicts a top view of one example embodiment of a top firing five terminal LED package 200. The embodiment shown in FIG. 2 has the same LED connections shown in FIG. 1. The LED package 200 may emit light from the top of the package and may house a multicolor LED like that shown in FIG. 1. Although the examples discussed herein with respect to FIGS. 1 and 2 use the colors white, red, green and blue, any color LED may be used.

As shown in FIG. 2, the LED package 200 may include one window through which the colors emitted by the multicolor LED may pass. Alternative embodiments may have multiple windows. For example, the LED package may include four windows, in which each window emits the light emitted by one of the individual LEDs. In another example, the LED package may include two windows, in which the light emitted by the white LED may pass through a first window and the light emitted by the red, green and/or blue LED may pass through a second window.

The light emitted from the individual LEDs may be coupled using a light guide (not shown) located within, adjacent to, or formed as part of the LED package 200. Depending on the configuration of the individual LEDs (discussed below), one or more light guides may be used inside the LED package to couple the light from the LED through the LED package window. As discussed herein, the term LED may also include LED die. For example, one light guide may couple the light from the four LEDs such that the light emitted from any one of the four LEDs may be emitted from the window of the LED package. Alternatively, the LED package may have two windows, thus, two light guides may be used. A first light guide may couple light from the white LED through the first window and the second light guide may couple light from any of the red, green and/or blue LEDs through the second window.

Additionally, the physical arrangement of the individual LEDs within the package as shown in FIG. 2, may be arranged in a two by two grid, may be arranged in a horizontal linear pattern, a vertical linear pattern or any grid or pattern including randomly. The configuration of the LEDs within the package may depend on the intended use of the package, the size of the LEDs, the desired uniformity of the color to be emitted from the package and so on. For example, the white LED may be centrally located and the red, green and blue LEDs may be arranged around the white LED to increase the color uniformity and intensity uniformity of the emitted light from the multicolor LED.

The LED package 200 in FIG. 2 has six physical terminals, including five functionally different terminals, and thus the LED package 200 may be referred to herein as a "five terminal LED" package. Two of the terminals, namely a first anode terminal 220 and a second anode terminal 222 may be operationally or directly connected to the common anode of the multicolor LED. Although the LED package 200 includes two anode terminals, the first anode terminal 220 and the second anode terminal 222, both of the anode terminals may functionally serve the same purpose. Stated differently, the first and second anode terminals 220 and 222 of FIG. 2 may both be operationally or directly connected to common anode 120 of FIG. 1 and may be used interchangeably. Different anode connections will be discussed in further detail below.

LED package 200 also may include four cathode terminals as shown in FIG. 2. Cathode terminal 210 may be operationally or directly connected to the cathode of white LED 110 of FIG. 1 and cathode terminals 212, 214 and 216 may be operationally or directly connected to the cathodes of red LED 112, green LED 114 and blue LED 116 of FIG. 1. Generally, terminals may be referred to as operationally connected in various arrangements that allow the terminal to operate in a similar manner as a direct connection. For example, a terminal may be operationally connected even though an additional electrical component such as a resistor may be inserted in the connection between the terminal and the LED. Additionally, the terminals may be located such that the LED package 200 may be used interchangeably with other six terminal device packages. The LED package may be sized such that a backlit keyboard may have one LED package underlying and backlighting each individual key. However, the size of the LED package 200 may depend on the intended use of the LED package, on the size of the individual LED die and so on.

Figure 3:
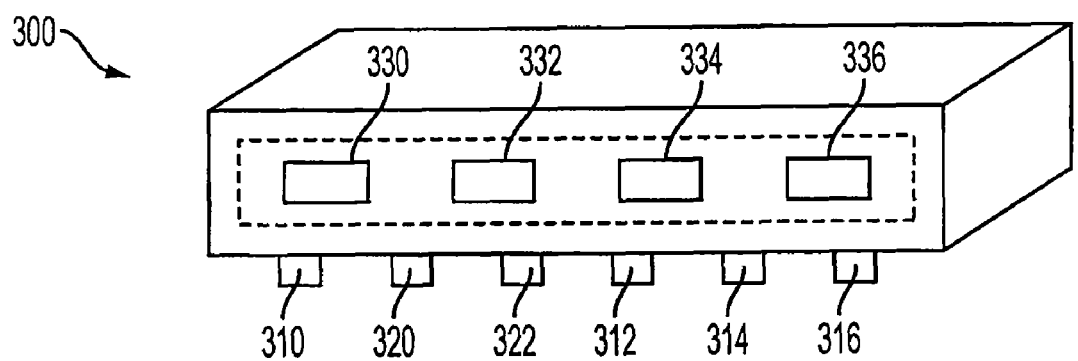
FIG. 3 depicts another embodiment of the present invention as a side firing five terminal multicolor LED package.

FIG. 3 depicts a side view of another example embodiment of a side firing five terminal LED package 300. The embodiment shown in FIG. 3 has the same LED connections shown in FIG. 1. The LED package 300 may emit light from the side of the package through a transparent window and, similar to the LED package 200 of FIG. 2, may enclose a multicolor LED. In FIG. 3, the multicolor LED package 300 may include individual LEDs 330, 332, 334 and 336 which may emit white, red, green and blue light respectively. The individual LEDs may be configured within the multicolor LED as described in FIG. 1. Although the examples discussed herein use the colors white, red, green and blue, any color LEDs may be used.

FIG. 3 has six physical terminals, including five functionally different terminals. The first and second anode terminals 320 and 322 may be operationally or directly connected to the common anode of the multicolor LED. As previously discussed with respect to FIG. 2, although the LED package 300 includes two anode terminals 320 and 322, both of the anode terminals may functionally serve the same purpose in that either one of the anode terminals 320, 322 may be used interchangeably.

The side firing LED package 300 also may include four cathode terminals. Cathode terminal 310 may be operationally or directly connected to the cathode of white LED 310 of FIG. 3 and cathode terminals 312, 314 and 316 may be operationally or directly connected to the cathodes of red LED 312, green LED 314 and blue LED 316 of FIG. 3. Additionally, although the die and the LED package terminals are depicted in a specific order, the die and the package terminals may be arranged in any order. Also, the anode terminals 320, 322 of FIG. 3 are shown adjacent to one another, but may be located in any position on the LED package, including alternating with the cathode terminals, at opposite ends of the LED package and so on. Because the white LED 330 and the blue LED 336 are both connected to a common anode (shown in FIG. 1), either one of the first or second anode terminals 320, 322 may be connected to the power source so that the LEDs 330, 336 may be switched on (stated differently, both first and second anode terminals 320 and 322 need not be connected to the power source to turn on LEDs 330, 336).

Depending on the intended use of the LED package, either of a top-firing or side-firing LED package 200 may be used. For example, for backlighting a keyboard, the top-firing LED package may be used as it allows light to be emitted from the top of the package. Stated differently, in a backlit keyboard, the multicolor LED may be located beneath the keyboard, thus making it useful to employ a top firing LED package.

Figure 4:
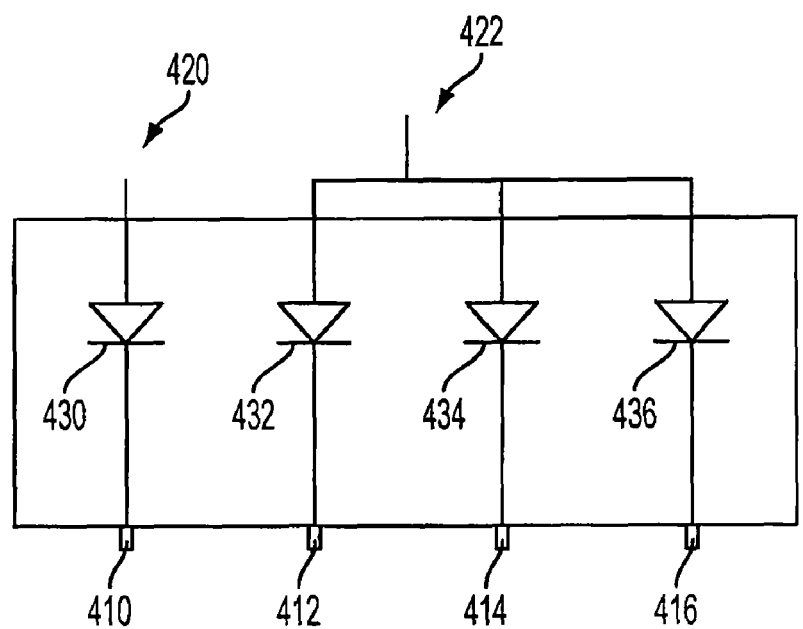
FIG. 4 depicts another embodiment of a multicolor LED schematic.

FIG. 4 depicts a schematic of another embodiment of an electronic device 400. The electronic device 400 may be a multicolor LED, which may emit one or multiple colors individually or in any combination and may include individual LEDs, 430, 432, 434, 436. Similar to the embodiment shown in FIG. 1, the individual LEDs 430, 432, 434, 436, may emit the colors white, red, green and blue respectively. The schematic of FIG. 4 includes two anodes, 420 and 422, in which anode 422 is a common anode for the red LED 432, green LED 434 and blue LED 436. In the six terminal multicolor LED, the anode 422 may be connected to any three of the individual LED anodes. In one example, the anode 422 may be connected to the anodes of the white LED 430, the red LED 432 and the green LED 434.

Figure 5:
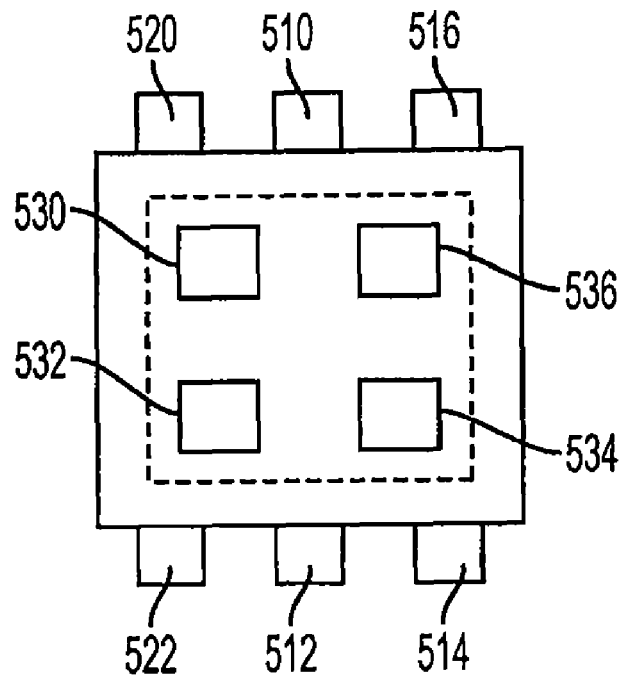
FIG. 5 depicts another embodiment of the present invention as a top firing six terminal multicolor LED package.

The six terminal multicolor LED discussed with respect to FIG. 4 is included within the LED package depicted in FIG. 5. Accordingly, the embodiment shown in FIG. 5 has the same LED connections shown in FIG. 4. FIG. 5 provides a top view illustration of a top firing six terminal LED package 500. Similar to the LED packages illustrated in FIG. 3, the top firing LED package 500 may emit light from its top and has six physical terminals. The LED package 500 includes a first anode 520 and a second anode 522, which may be connected to different individual LED anodes and are not interchangeable with one another since the functionality of the first and second anodes is different with respect to one another. In the embodiment of FIG. 5, depending on the emitted colors of light desired, either first anode 520 or second anode 522 may be connected to the power source, and thus connect the respective LED. For example, the first anode 520 may be connected to the power source and a white light may be emitted from white LED 530. FIG. 5 also includes cathodes 510, 512, 514, 516, which may be operationally and/or directly connected to the cathodes of white LED 530, red LED 532, green LED 534 and blue LED 536.

In one example of the embodiment shown in FIG. 5, the LED package may emit a red light and a white light. In this example, both of the anodes 520, 522 may be connected to the power source so that the LEDs 530, 536 may be switched on. Distinct from the embodiment shown in FIG. 3 and as previously mentioned, anode 520 may be connected to the anode terminal of white LED 530 and anode 522 may be connected to the anodes of red, green and blue LEDs. Additionally, the cathodes 510, 516 may be connected to the power source so that the LEDs 330, 336 may be switched on and emit white and blue light respectively.

In another example of FIG. 5, the LED package 500 may emit a yellow color. In this example, the anode 522 and the cathodes of green LED 534 and blue LED 536 may be connected to the power source so that the individual blue and green LEDs may emit light. Continuing this example, the white LED 530 may not emit light as the anode 520 need not be connected to the power source. Because the anode of the white LED 530 may not be connected to a power source, white LED 530 may have the ability to be switched on even if a bias is applied to the cathode.

Figure 6:
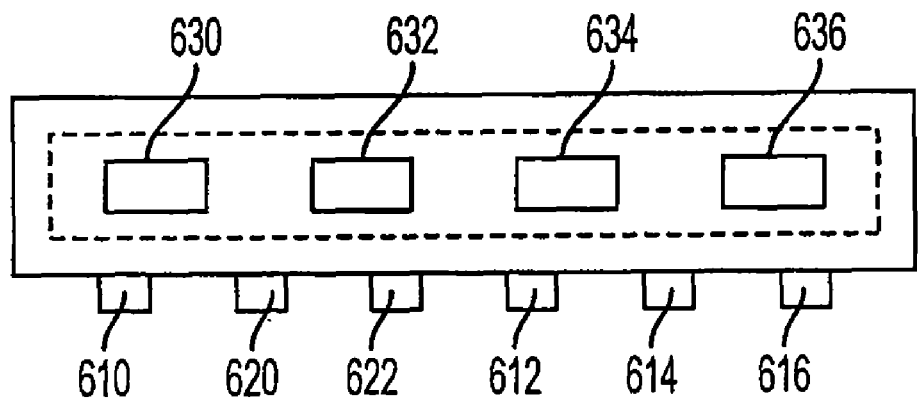
FIG. 6 depicts another embodiment of the present invention as a side firing six terminal multicolor LED package.

FIG. 6 depicts yet another embodiment of an LED package 600, which may be a six terminal side firing LED package 600. The embodiment shown in FIG. 6 has the same LED connections shown in FIG. 4. As previously discussed with respect to FIG. 3, side-firing LED package 600 may emit light from the side of the package, may include four individual LEDs, (e.g., white, red, green and blue) and may include a window which may allow the light emitted from the individual LEDs to pass through. LED package 600 may include anodes 620, 622 which may be similarly connected as the anodes 420, 422 of LED 400. Anode 620 may be connected to the anode of the white LED 630 and anode 622 may be connected to a common anode which, in turn, may be connected to the anodes of red LED 632, green LED 634 and blue LED 636. Also similar to the LED package 500 of FIG. 5, anodes 620 and 622 may both be connected to a power source, thus allowing any one of the LEDs to be switched on and emit light.

Although five and six terminal packages have been discussed herein as examples, a package may include any number of terminals. For example, an LED package may include a multicolor LED that may emit four colors. The multicolor LED may be electrically configured similar to the schematic of FIG. 4, in which the multicolor LED may include four individual LEDs and also may include two anodes one of which is a common anode for three of the LED (red, green and blue LEDs) anodes, and the second anode which may be connected to an individual white LED anode. The package may also include ten terminals in which four of the terminals may be connected to the cathodes of the individual LEDs, two of the terminals may be connected to the white LED anode and the remaining three terminals may be connected to the common anode for the three individual color LEDs.

In another embodiment, a side-firing LED package may emit a blue light and a white light, when the blue LED and the white LED are active. In this embodiment, the side-firing LED package may have four different color LEDs (for example, white, red, green, blue), and each LED may have separate anode and separate cathodes. Thus, it may be possible to produce different intensity light from each individual LED, and more than one LED may emit light at the same time. For example, the anodes of the blue and the white light may be separately connected to separate power sources so that the blue and white LEDs may be switched on and emit white and blue light respectively and the intensity of the light produced by each may be separately controlled.

Figure 7:
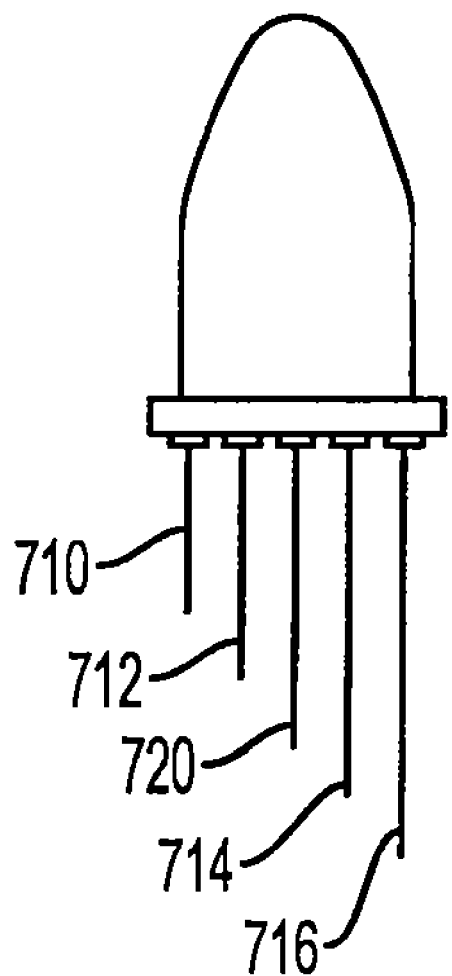
FIG. 7 depicts yet another embodiment of the present invention in another LED multicolor package.

FIG. 7 depicts yet another LED package 700. The LED package 700 may be configured to include various numbers of terminals, but is illustrated in FIG. 7 with five terminals. The LED package 700 may function similarly to the LED packages described herein with respect to FIGS. 1-6.

Figure 8:
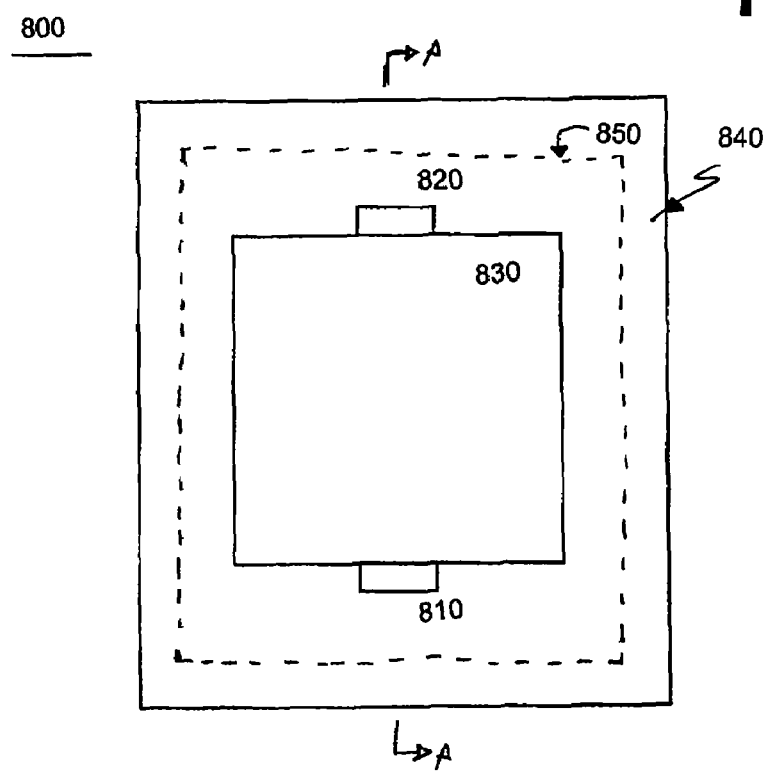
FIG. 8 depicts a top-down view of an alternative multicolor LED package.

FIG. 8 depicts an implementation of a multicolor LED package 800 having two side-firing LEDs, namely one multicolor LED 810 and one white LED 820. As shown in FIG. 8, the multicolor LED 810 and white LED 820 are situated at opposing sides of the light guide 830. By positioning the LEDs in this fashion, each may have a relatively large and uniform dispersal pattern for emitted light, since neither LED is located closer to one adjacent side than the other. A package 850 may surround the LEDs and light guide and is shown in dashed lines. It should be noted that such a package is optional with respect to this or other embodiments discussed herein. Further, the package, LEDs, and/or light guide(s) generally are situated or, or electrically connected to, a base such as a printed circuit board 840.

Figure 9:
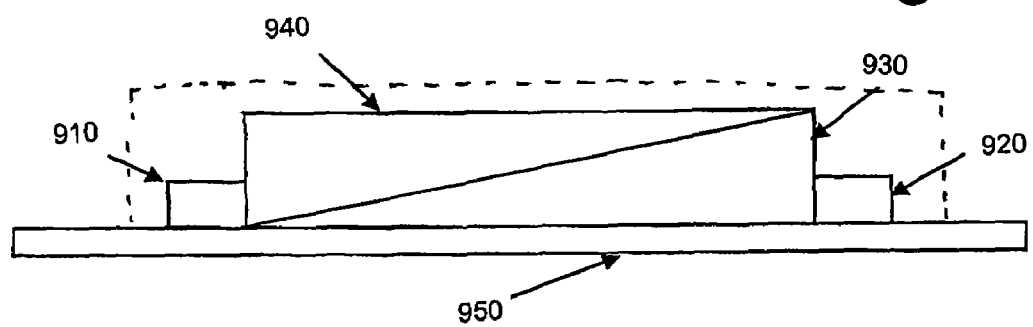
FIG. 9 depicts a cross-sectional view of the LED package of FIG. 8, showing one sample cross-section taken along line A-A of FIG. 8.

FIG. 9 shows one sample cross-section for the LED package 800 of FIG. 8, generally taken along line A-A of FIG. 8. In particular, FIG. 9 depicts the configuration of the light guides 930, 940 for the multicolor LED 910 and white LED 920. Each light guide 930, 940 is generally ramp-shaped in a vertical cross section and a rectangular prism in a lateral cross section (the length of the rectangular prism varying with the point at which the cross-section is taken, due to the angled edge of the ramp). The first light guide 940 directs and/or diffuses light from the multicolor LED 910 in a desired pattern in order to illuminate an item above the waveguide while the second light guide 930 does the same for the white LED 920. It should be noted that the second light guide 930 may be configured to take into account the scattering pattern of the first light guide 940. That is, since the second light guide is located beneath the first light guide, the two may cooperate to provide a desired final illumination pattern for the white LED.

In alternative embodiments, the upper, first light guide may be optically coupled to the white LED 920 and the second, lower light guide 930 optically coupled to the multicolor LED 910 (for example, the positions of the LEDs may be flipped).

Figure 10:
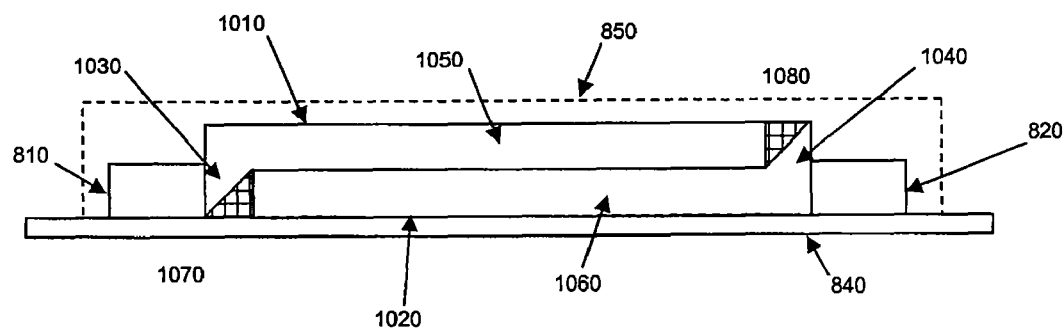
FIG. 10 depicts an alternate cross-sectional view of the LED package of FIG. 8, showing a second sample cross-section taken along line A-A of FIG. 8.

FIG. 10 depicts an alternate construction of the LED package 800 of FIG. 8, particularly with respect to the configuration of the light guides 1010, 1020. This cross-section may also be taken along line A-A of FIG. 8 when the alternate construction is employed. Here, instead of being ramp-shaped like the light guides 910, 920 of FIG. 9, each light guide 1010, 1020 is formed from a ramp-shaped portion 1030, 1040 and a rectangular prism portion 1050, 1060. Each ramp-shaped portion is adjacent to and contiguous with the associated rectangular prism portion. The ramp-shaped portion directs light exiting the appropriate LED 810, 820 either upward or downward into the rectangular prism, where the light is emitted upward. Further, the shaded areas 1070, 1080 at the end of each rectangular prism 1050, 1060 may be part of the light guide and formed from the same material, in which case they are contiguous with the adjacent rectangular prism, may be empty air or may be formed from another material, such as an insulator, opaque or reflective material.

Figure 11:
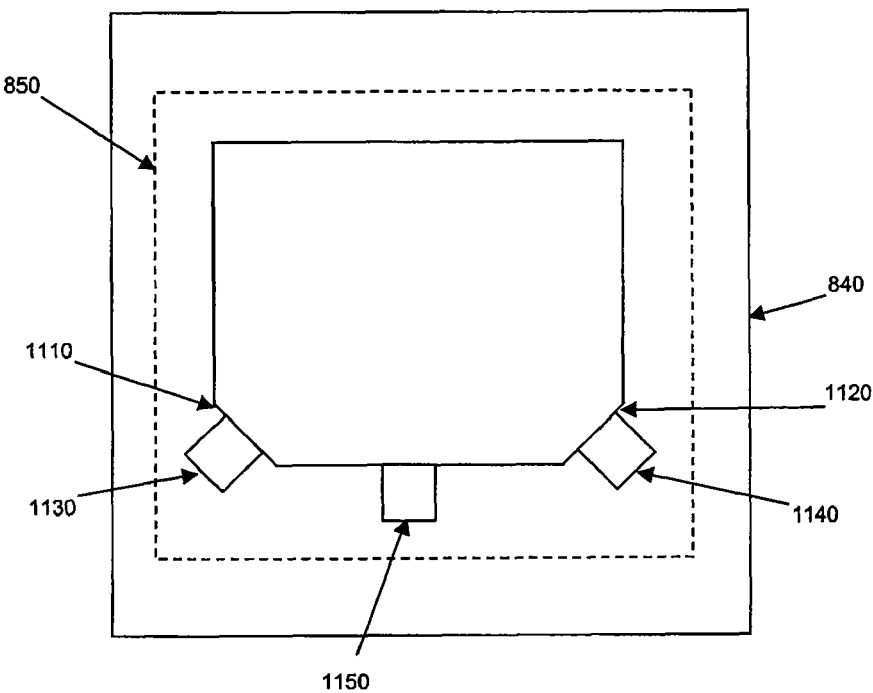
FIG. 11 depicts a top-down view of yet another multicolor LED package.

Although FIGS. 8-10 depict the multicolor LED and white LED on opposing sides of the LED package, it should be appreciated that the LEDs may be located on the same or adjacent sides. If on the same side, the LEDs may be side by side, stacked vertically, or separated. Further, some embodiments may employ multiple white LEDs, multiple multicolor LEDs, or a white LED and several color-emitting LEDs. In one sample embodiment, two white LEDs may be used. The LED light guide may have two angled corners 1110, 1120 extending between sides of the package 1100, as shown to best effect in the top-down view of FIG. 11. The white LEDs 1130, 1140 may be positioned adjacent these angled corners so that light may be emitted into the interior of the package 1100 and thus into a light guide (not shown). Because each angled corner extends at approximately 135 degrees from the adjacent sidewalls, the white light emitted by the white LEDs may be evenly dispersed and mixed. It should be appreciated that a single light guide may be used for both white LEDs or both white LEDs and the multicolor LED 1150. Again, multiple single-color LEDs may be used in place of the multicolor LED. Likewise, certain embodiments may use two multicolor LEDs and a single white LED and reverse the positions depicted in FIG. 11. Further, in certain embodiments the angle of the corner(s) may be more or less than 135 degrees. As yet another alternative, the package 850 may include angled corners and the LEDs may sit outside the package.

Although the present invention has been described with respect to particular apparatuses, configurations, components, systems and methods of operation, it will be appreciated by those of ordinary skill in the art upon reading this disclosure that certain changes or modifications to the embodiments and/or their operations, as described herein, may be made without departing from the spirit or scope of the invention. Accordingly, the proper scope of the invention is defined by the appended claims. The various embodiments, operations, components and configurations disclosed herein are generally exemplary rather than limiting in scope.

What is claimed is:
1. A multicolor light emitting package comprising:
a white light emitting diode operative to emit a white light;
a multicolor light emitting diode operative to emit a colored light;

a first light guide optically coupled to the white light emitting diode and having a first ramp shape; and a second light guide optically coupled to the multicolor light emitting diode and having a second ramp shape, the second light guide adjacent the first ramp-shaped light guide;

the first and second light guides configured to combine the white light and the colored light, thereby producing an output light.

2. The multicolor light emitting package of claim 1 further comprising:

a housing enclosing at least the at least one light guide; and a window defined by the housing, wherein the outputted light travels through the window.

3. The multicolor light emitting package of claim 1 further comprising four cathode terminals and a common anode terminal, wherein the cathode and the anode are connected to the housing, further wherein each one of the four cathode terminals is operationally connected on a one to one basis to each of the cathodes of the white, red, green and blue light emitting diodes and the common anode terminal is operationally connected to all of the anodes of white, red, green and blue light emitting diodes.

4. The multicolor light emitting package of claim 3 wherein the housing comprises six terminals wherein two of the terminals are both operationally connected to all of the anodes of the white, red, green and blue light emitting diodes.

5. The multicolor light emitting package of claim 1 further comprising a first and a second anode terminal, both of which are connected to the housing wherein, the first anode terminal is a common anode terminal operationally connected to all of the anodes of the red, green and blue light emitting diode, further wherein the second anode terminal is connected to the anode of the white light emitting diode.

6. The multicolor light emitting package of claim 1, wherein the multicolor light emitting diode comprises:

a red light emitting diode;

a blue light emitting diode; and a green light emitting diode; wherein each of the red, blue and green light emitting diodes are optically coupled to the at least one light guide.

7. The multicolor light emitting package of claim 6 wherein the white, red, green and blue light emitting diodes are arranged in a two by two grid.

8. The multicolor light emitting package of claim 6 wherein the white, red, green and blue light emitting diodes are linearly arranged in a one by four grid.

9. The multicolor light emitting package of claim 1 wherein:

the first light guide comprises:

a first ramp-shaped section and a first elongate extension, the first ramp-shaped section and the first elongate extension contiguous with one another; and the second light guide comprises:

a second ramp-shaped section and a second elongate extension, the second ramp-shaped section and the second elongate extension contiguous with one another.

10. The multicolor light emitting package of claim 9, wherein:

the first light guide is located above the second light guide; and the second light guide is configured to transmit light through the first light guide.

* * * * *